(12) United States Patent
Wang

(10) Patent No.: US 10,547,023 B2
(45) Date of Patent: Jan. 28, 2020

(54) FLEXIBLE DISPLAY PANEL AND MANUFACTURING METHOD THEREOF AND FLEXIBLE DISPLAY DEVICE

(71) Applicant: WUHAN CHINA STAR OPTOELECTRONICS SEMICONDUCTOR DISPLAY TECHNOLOGY CO., LTD., Wuhan, Hubei (CN)

(72) Inventor: Xing Wang, Guangdong (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 223 days.

(21) Appl. No.: 15/736,724

(22) PCT Filed: Nov. 23, 2017

(86) PCT No.: PCT/CN2017/112470
§ 371 (c)(1),
(2) Date: Dec. 14, 2017

(87) PCT Pub. No.: WO2019/085072
PCT Pub. Date: May 9, 2019

(65) Prior Publication Data
US 2019/0386240 A1    Dec. 19, 2019

(30) Foreign Application Priority Data

Nov. 6, 2017 (CN) .......................... 2017 1 1081451

(51) Int. Cl.
*H01L 27/32* (2006.01)
*H01L 51/52* (2006.01)
*H01L 51/56* (2006.01)

(52) U.S. Cl.
CPC ...... *H01L 51/5209* (2013.01); *H01L 27/3258* (2013.01); *H01L 51/56* (2013.01); *H01L 2227/323* (2013.01); *H01L 2251/5338* (2013.01)

(58) Field of Classification Search
None
See application file for complete search history.

(56) References Cited

U.S. PATENT DOCUMENTS

2005/0218794 A1* 10/2005 Seo ................... H01L 51/5271
                                                                313/504
2008/0150421 A1*  6/2008 Takata ............... H01L 27/3244
                                                                313/504

(Continued)

*Primary Examiner* — Jack S Chen
(74) *Attorney, Agent, or Firm* — Hemisphere Law, PLLC; Zhigang Ma

(57) ABSTRACT

The present disclosure discloses a flexible display panel including a device layer, an organic planarization layer formed on the device layer, a light-emitting unit formed on the planarization layer, and an anode layer of the light-emitting unit adjacent contacted to the organic planarization layer. The organic planarization layer includes at least one first connection hole and at least one second connection hole; an output end of the device layer is connected with the anode layer through the first connection hole; the second connection hole has a depth smaller than the thickness of the organic planarization layer, and the anode layer of the light-emitting unit is further connected to the organic planarization layer through the second connection hole. The flexible display panel can protect the anode layer of the flexible display device from cracking due to poor flexibility during the bending process and improve the quality of the flexible display device.

19 Claims, 1 Drawing Sheet

(56) References Cited

U.S. PATENT DOCUMENTS

| | | | |
|---|---|---|---|
| 2008/0230770 A1* | 9/2008 | Yoon | H01L 27/3265 257/40 |
| 2013/0168648 A1* | 7/2013 | Jeong | H01L 27/3225 257/40 |
| 2019/0131368 A1* | 5/2019 | Zhang | H01L 27/3258 |

* cited by examiner

FLEXIBLE DISPLAY PANEL AND MANUFACTURING METHOD THEREOF AND FLEXIBLE DISPLAY DEVICE

RELATED APPLICATIONS

The present application is a National Phase of International Application Number PCT/CN2017/112470, filed Nov. 23, 2017, and claims the priority of China Application No. 201711081451.2, filed Nov. 6, 2017.

FIELD OF THE DISCLOSURE

The present disclosure relates to a terminal display field, and more particularly to a flexible display panel and a manufacturing method thereof and a flexible display device.

BACKGROUND OF THE DISCLOSURE

The flexible display panel is an arbitrary curved and deformed display panel made of flexible material. Due to its light weight, small size and thin profile, the flexible display panel is easy to carry; it has high temperature resistance, impact resistance and shock resistance, and can adapt to different working environments; because of its curly, more aesthetic appearance, in recent years has become the focus of domestic and foreign universities and research institutions. The conventional flexible display device generally adopts a flexible material as a substrate, for example, polyimide. Due to the bendability of the flexible substrate, together with the organic light-emitting device fabricated on the flexible substrate and the thin-film encapsulation layer as the water and oxygen barrier on the organic light-emitting device, the flexible display made by these laminated structures can be well bent, enabling the display to be bendable.

However, the anode layer in the light-emitting unit is mainly made of indium tin oxide material. Since indium tin oxide material itself is relatively brittle and has poor flexibility, it is easy to break during flexing of the flexible display device, resulting in breakage of the anode layer wiring and abnormal display of the flexible display.

Therefore, it is necessary to improve the prior art flexible display panel to improve the stability of use and extend the service life.

SUMMARY OF THE DISCLOSURE

Therefore, an object of the present disclosure is to provide a flexible display panel, a manufacturing method thereof and a flexible display device, which can effectively improve the stability of use of the flexible display panel and prolong the service life of the flexible display panel.

In order to solve the above technical problem, a technical solution adopted by the present disclosure is to provide a flexible display panel, the flexible display panel includes a device layer, an organic planarization layer formed on the device layer, a light-emitting unit formed on the planarization layer, and an anode layer of the light-emitting unit adjacent contacted to the organic planarization layer; wherein the organic planarization layer includes at least one first connection hole and at least one second connection hole; the output end of the device layer is connected with the anode layer through the first connection hole; the second connection hole has a depth smaller than the thickness of the organic planarization layer, and the anode layer of the light-emitting unit is further connected to the organic planarization layer through the second connection hole.

In order to solve the above technical problem, another technical solution adopted by the present disclosure is to provide a flexible display device. The flexible display device includes a flexible display panel, the flexible display panel includes a device layer, an organic planarization layer formed on the device layer, a light-emitting unit formed on the planarization layer, and an anode layer of the light-emitting unit adjacent contacted to the organic planarization layer wherein the organic planarization layer includes at least one first connection hole and at least one second connection hole; the output end of the device layer is connected with the anode layer through the first connection hole; the second connection hole has a depth smaller than the thickness of the organic planarization layer, and the anode layer of the light-emitting unit is further connected to the organic planarization layer through the second connection hole.

In order to solve the above technical problem, the other technical solution adopted by the present disclosure is to provide a manufacturing method of a flexible display panel. The manufacturing method includes: preparing a device layer; forming an organic planarization layer on the device layer, and forming at least one first connection hole and at least one second connection hole on the organic planarization layer, wherein the second connection hole has a depth smaller than the thickness of the organic planarization layer; and forming a light-emitting unit on the organic planarization layer, wherein an anode layer of the light-emitting unit is adjacent contacted to the organic planarization layer through the second connection hole and is communicated with an output end of the device layer through the first connection hole.

The beneficial effect of the present disclosure is that the anode of the light-emitting unit is further connected to the organic planarization layer through the second connection hole by providing at least one first connection hole and at least one second connection hole on the organic planarization layer. The anode layer of the flexible display device can be protected from being broken due to poor flexibility during the bending process and improving the quality of the flexible display device.

DETAILED DESCRIPTION OF PREFERRED EMBODIMENTS

The present disclosure is described in detail below with reference to the accompanying drawings and embodiments.

Figure 1:
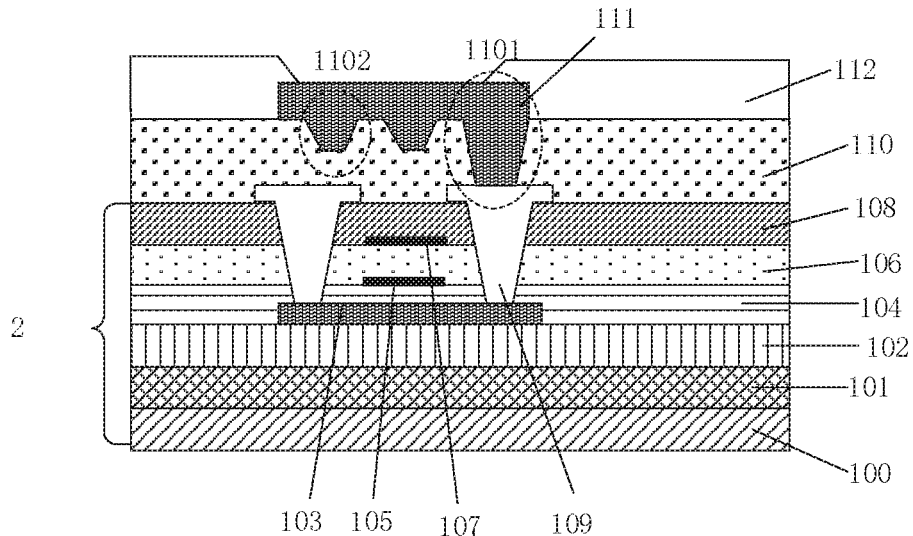
FIG. 1 is a schematic cross-sectional diagram of an embodiment of the flexible display panel of the present disclosure.

Referring to FIG. 1, FIG. 1 is a schematic cross-sectional diagram of an embodiment of the flexible display panel of the present disclosure.

As shown in FIG. 1, in the present embodiment, the flexible display panel includes a device layer 2, an organic planarization layer 110 formed on the device layer 2, a light-emitting unit 112 formed on the planarization layer 110, and an anode layer 111 of the light-emitting unit 112 adjacent contacted to the organic planarization layer 110.

Wherein the device layer 2 includes a first substrate 100, and an organic thin film layer 101, a buffer layer 102, an active layer 103, a gate insulating layer 104, a gate metal layer 105, a second insulating layer 106, a second metal layer 107, an interlayer insulating layer 108, and a source/drain metal layer 109 adjacent to the active layer 103 sequentially stacked on the first substrate 100.

The first substrate 100 includes a glass substrate and a quartz substrate. In other embodiments, the first substrate 100 may be another substrate, which is not limited herein.

The gate insulating layer 104 includes at least one of silicon nitride SiNx and amorphous silicon oxide SiOx. In other embodiments, the gate insulating layer 104 may be other insulating materials, which are not limited herein.

The gate metal layer 105 is formed by depositing a metal film layer on a first substrate, exposing the metal film layer through a first photomask, and etching the metal film layer. Among them, the first photomask is a normal photomask that can be etched only one layer.

The metal film layer includes at least one of aluminum Al, molybdenum Mo, copper Cu and silver Ag. In other embodiments, the metal film may be other metals, which are not limited herein.

In addition, the organic thin film layer 101 coated on the first substrate 100 is a flexible material, for example, the main component is polyimide. In other embodiments, other flexible materials may also be used, which are not limited herein. In order to ensure the flexibility of the flexible display panel, while not causing the burden of the thickness of the flexible display panel. In a preferred embodiment, the organic thin film layer 101 has a thickness of 10 micrometers to 20 micrometers. In other embodiments, the thickness of the organic thin film layer 101 may be separately set according to actual requirements, which is not limited herein.

In addition, in the present embodiment, the buffer layer 102 has a thickness of 200 nm to 300 nm. The active layer 103 has a thickness of 40 nanometers to 50 nanometers. The gate insulating layer 104 has a thickness of 50 nanometers to 200 nanometers. The thickness of the gate metal layer 105 is 150 nanometers to 250 nanometers.

Specifically, the second insulating layer 106 and the second metal layer 107 are sequentially formed on the gate metal layer 105. The second insulating layer 106 has a thickness of 50 nanometers to 200 nanometers. The second metal layer 107 has a thickness of 150 nanometers to 250 nanometers. The second insulating layer 106 and the second metal layer 107 can be patterned by photolithography and dry etching techniques. The material of the second metal layer 107 includes at least one of aluminum Al, molybdenum Mo, copper Cu, and silver Ag. In other embodiments, the second metal layer 107 may be other metals, which are not limited herein.

Specifically, an interlayer insulating layer 108 and a source/drain metal layer 109 are sequentially formed on the second metal layer 107, wherein the source and the drain of the source/drain metal layer 109 are separated by a channel. The interlayer insulating layer 108 has a thickness of 500 nm to 700 nm. The source/drain metal layer 109 has a thickness of 400 nanometers to 600 nanometers and includes titanium and aluminum. In other embodiments, the source/drain metal layer 109 may be other metal materials, which is not limited herein. The interlayer insulating layer 108 and the source/drain metal layer 109 are all patterned by a half-tone mask and a developing technique.

Specifically, the organic planarization layer 110 formed on the device layer 2 has a thickness of 1.5 micrometers to 3 micrometers, and the main component is polyimide. The organic planarization layer 110 is also patterned by a half-tone mask and a developing technique.

Specifically, the anode layer 111 that is in contact with the light-emitting unit 112 adjacent to the organic planarization layer 110 mainly uses an indium tin oxide material. However, since indium tin oxide material itself is relatively brittle and has poor flexibility, it is easy to break during bending of the flexible display device, resulting in breaking of the anode layer line and abnormality of the flexible display. In this embodiment, the thickness of the anode layer 111 is set to be 100 nanometers to 250 nanometers to better reduce the influence caused by the poor flexibility of the anode layer 111.

In this embodiment, the organic planarization layer 110 includes at least one first connection hole 1101 and at least one second connection hole 1102. The output end of the device layer 2 is connected to the anode layer 111 through the first connection hole.

In a specific implementation scenario, the output of the device layer 2 is the source terminal or the drain terminal of the source-drain metal layer 109 in the display panel. Since the output end of the device layer 2 is connected to the anode layer 111 through the first connection hole 1101, it can be understood that the first connection hole 1101 drills through the organic planarization layer 110. The depth of the first connection hole 1101 is greater than or equal to the thickness of the organic planarization layer.

In the present embodiment, the depth of the second connection hole 1102 is less than the thickness of the organic planarization layer 110, and the anode layer 111 of the light-emitting unit 112 is further connected to the organic planarization layer 110 through the second connection hole 1102.

In a specific implementation scenario, a portion of the anode layer 111 enters the second connection hole 1102, and another portion overlaps the organic planarization layer 110. In this way, the contact surface between the anode layer 111 and the organic planarization layer 110 can be increased. In this way, when the flexible display panel is bent, the anode layer 111 is no longer a simple plane force, and the problem that the anode layer 111 breaks the anode layer due to the poor flexibility can be reduced by dispersing the stress multi-angles.

In an optional embodiment, the first connection hole 1101 or/and the second connection hole 1102 are formed by exposing and developing the patterned half-tone mask.

Wherein, the cross section of the first connection hole 1101 or/and the second connection hole 1102 is circular or square. In other embodiments, the cross-section of the first connection hole 1101 and/or the second connection hole 1102 may also be other regular or irregular patterns, which are not limited herein, as long as the shapes of the other portions connected to the first connection hole 1101 and/or the second connection hole 1102 correspond to each other.

For example, in a specific implementation scenario, the shape and size of the cross-section of the first connecting hole 1101 and the second connecting hole 1102 and the inclination angle, the depth and the like of the connecting hole may be changed according to the thickness of the organic planarization layer 110 and the anode layer 111. For example, when the thickness of the anode layer 111 is less than 100 nanometers, the depth of the second connection hole 1102 may be appropriately reduced to maintain the integrity of the anode layer 111.

It can be seen from the above description that, different from the prior art, the flexible display panel provided by the present disclosure, by providing at least one first connection hole and at least one second connection hole on the organic planarization layer, the anode of the light-emitting unit is further connected to the organic planarization layer through the second connection hole. The anode layer of the flexible display device can be protected from being broken due to poor flexibility during the bending process, improving the quality of the flexible display device and prolonging the service life of the display device.

The present disclosure further provides a flexible display device. The flexible display device includes the flexible display panel according to any one of the above embodiments. Please refer to FIG. 1 and the related text descriptions for details, and details are not described herein again.

It can be seen from the above description that, different from the prior art, the flexible display device provided by the present disclosure, by providing at least one first connection hole and at least one second connection hole on the organic planarization layer, the anode of the light-emitting unit is further connected to the organic planarization layer through the second connection hole. The anode layer of the flexible display device can be protected from being broken due to poor flexibility during the bending process, improving the quality of the flexible display device and prolonging the service life of the display device.

Figure 2:
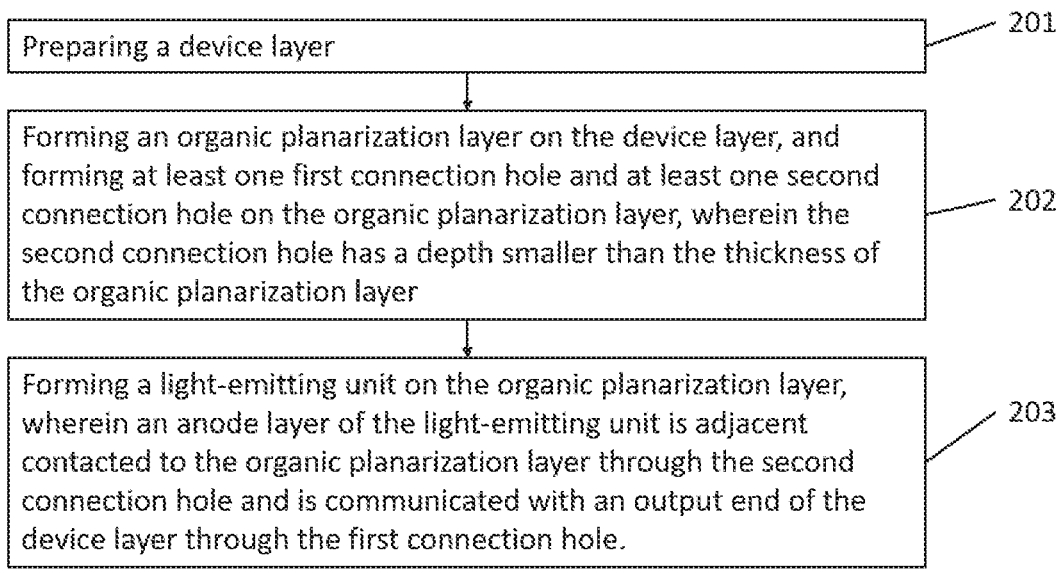
FIG. 2 is a schematic flow chart of an embodiment of the manufacturing method of a flexible display panel of the present disclosure.

The present disclosure further provides a manufacturing method of a flexible display panel, as shown in FIG. 2, the manufacturing method includes the steps of:

step 201: preparing a device layer.

In a specific implementation scenario, a thin film layer is first coated on a first substrate, and then a buffer layer, an active layer, a gate insulating layer, a gate metal layer, a second insulating layer, a second metal layer, an interlayer insulating layer and a source/drain metal layer adjacent to the active layer are sequentially formed on the organic thin film layer.

The organic thin film layer has a thickness of 10 micrometers to 20 micrometers. The thickness of the buffer layer is 200 nanometers to 300 nanometers. The active layer has a thickness of 40 nanometers to 50 nanometers. The gate insulating layer has a thickness of 50 nanometers to 200 nanometers. The gate metal layer has a thickness of 150 nanometers to 250 nanometers. The second insulating layer has a thickness of 50 nanometers to 200 nanometers. The second metal layer has a thickness of 150 nanometers to 250 nanometers. The material of the second metal layer includes at least one of aluminum Al, molybdenum Mo, copper Cu and silver Ag. In other embodiments, the second metal layer may also be other metals, which are not limited herein. The thickness of the interlayer insulating layer is 500 nm to 700 nm. The source/drain metal layer has a thickness of 400 nm to 600 nm, and includes titanium and aluminum. In other embodiments, the source/drain metal layer may also be other metal materials, which is not limited herein.

step 202: forming an organic planarization layer on the device layer, and forming at least one first connection hole and at least one second connection hole on the organic planarization layer, wherein the second connection hole has a depth smaller than the thickness of the organic planarization layer.

Wherein the thickness of the organic planarization layer is 1.5 micrometers to 3 micrometers.

In a specific implementation scenario, the first connection hole or/and the second connection hole are formed by half-tone mask exposure and development patterning. The cross section of the first connection hole or/and the second connection hole is circular or square. In other embodiments, the cross-section of the first connection hole or/and the second connection hole may also be other regular or irregular patterns, which are not limited herein, as long as the shapes of the other portions connected to the first connection hole and/or the second connection hole correspond to each other.

step 203: forming a light-emitting unit on the organic planarization layer, wherein an anode layer of the light-emitting unit is adjacent contacted to the organic planarization layer through the second connection hole and is communicated with an output end of the device layer through the first connection hole.

The anode layer adjacent to the light-emitting unit adjacent to the organic planarization layer mainly adopts an indium tin oxide material. However, since indium tin oxide material itself is relatively brittle and has poor flexibility, it is easy to break during bending of the flexible display device, resulting in breaking of the anode layer line and abnormality of the flexible display. In this embodiment, the thickness is set to be 100 nanometers to 250 nanometers in order to better reduce the influence of poor flexibility of the anode layer.

In one embodiment, when the anode layer is formed, the anode layer is connected to the source/drain metal layer of the device layer through the first connection hole and is adjacent to the organic planarization layer through the second connection hole.

It can be seen from the above description that, different from the prior art, the manufacturing method of a flexible display panel provided by the present disclosure, by providing at least one first connection hole and at least one second connection hole on the organic planarization layer, the anode of the light-emitting unit is further connected to the organic planarization layer through the second connection hole. The anode layer of the flexible display device can be protected from being broken due to poor flexibility during the bending process, improving the quality of the flexible display device and prolonging the service life of the display device.

It should be understood by those skilled in the art that various modifications and variations can be made in the light of the technical solutions and technical concepts of the present disclosure. All such changes and modifications shall fall within the protection scope of the appended claims of the present disclosure.

What is claimed is:

1. A flexible display panel, comprising a device layer, an organic planarization layer formed on the device layer, a light-emitting unit formed on the organic planarization layer, and an anode layer of the light-emitting unit adjacent contacted to the organic planarization layer; wherein the organic planarization layer comprises at least one first connection hole and at least one second connection hole; an output of the device layer is connected with the anode layer through the first connection hole; the second connection hole has a depth smaller than the thickness of the organic planarization layer, and the anode layer of the light-emitting unit is further connected to the organic planarization layer through the second connection hole.

2. The flexible display panel according to claim 1, wherein the cross section of the first connection hole or/and the second connection hole is circular or square.

3. The flexible display panel according to claim 1, wherein the first connection hole or/and the second connection hole are formed by half-tone mask exposure and development patterning.

4. The flexible display panel according to claim 1, wherein the organic planarization layer has a thickness of 1.5 micrometers to 3 micrometers.

5. The flexible display panel according to claim 1, wherein the anode layer has a thickness of 100 nanometers to 250 nanometers.

6. The flexible display panel according to claim 1, wherein the device layer comprises: a first substrate, and an organic thin film layer, a buffer layer, an active layer, a gate insulating layer, a gate metal layer, a second insulating layer, a second metal layer, an interlayer insulating layer, and a source/drain metal layer adjacent to the active layer sequentially stacked on the first substrate.

7. The flexible display panel according to claim 1, wherein the organic planarization layer is patterned by a half-tone mask and a development technique.

8. The flexible display panel according to claim 6, wherein the organic thin film layer is a flexible material.

9. A flexible display device comprising a flexible display panel, wherein the flexible display panel comprises a device layer, an organic planarization layer formed on the device layer, a light-emitting unit formed on the planarization layer, and an anode layer of the light-emitting unit adjacent contacted to the organic planarization layer; wherein the organic planarization layer comprises at least one first connection hole and at least one second connection hole; an output end of the device layer is connected with the anode layer through the first connection hole; the second connection hole has a depth smaller than the thickness of the organic planarization layer, and the anode layer of the light-emitting unit is further connected to the organic planarization layer through the second connection hole.

10. The flexible display device according to claim 9, wherein the cross section of the first connection hole or/and the second connection hole is circular or square.

11. The flexible display device according to claim 9, wherein the first connection hole or/and the second connection hole are formed by half-tone mask exposure and development patterning.

12. The flexible display device according to claim 9, wherein the organic planarization layer has a thickness of 1.5 micrometers to 3 micrometers.

13. The flexible display device according to claim 9, wherein the anode layer has a thickness of 100 nanometers to 250 nanometers.

14. A manufacturing method of a flexible display panel, comprising:
preparing a device layer,
forming an organic planarization layer on the device layer, and forming at least one first connection hole and at least one second connection hole on the organic planarization layer, wherein the second connection hole has a depth smaller than the thickness of the organic planarization layer, and
forming a light-emitting unit on the organic planarization layer, wherein an anode layer of the light-emitting unit is adjacent contacted to the organic planarization layer through the second connection hole and is communicated with an output end of the device layer through the first connection hole.

15. The manufacturing method of a flexible display panel according to claim 14, wherein the step of preparing a device layer specifically comprises:
sequentially preparing a first substrate, and an organic thin film layer, a buffer layer, an active layer, a gate insulating layer, a gate metal layer, a second insulating layer, a second metal layer, an interlayer insulating layer and a source/drain metal layer adjacent to the active layer stacked on the first substrate.

16. The manufacturing method of a flexible display panel according to claim 14, wherein the step of forming an organic planarization layer on the device layer, and forming at least one first connection hole and at least one second connection hole on the organic planarization layer, wherein the second connection hole has a depth smaller than the thickness of the organic planarization layer comprises:
forming the first connection hole or/and the second connection hole by half-tone mask exposure and development patterning.

17. The manufacturing method of a flexible display panel according to claim 16, wherein the cross section of the first connection hole or/and the second connection hole is circular or square.

18. The manufacturing method of a flexible display panel according to claim 14, wherein the organic planarization layer has a thickness of 1.5 micrometers to 3 micrometers.

19. The manufacturing method of a flexible display panel according to claim 14, wherein the anode layer has a thickness of 100 nanometers to 250 nanometers.

* * * * *